(12) United States Patent
Ibrahim et al.

(10) Patent No.: US 12,015,357 B2
(45) Date of Patent: Jun. 18, 2024

(54) COOLING SYSTEM FOR USE IN POWER CONVERTERS

(71) Applicant: DCBEL INC., Montréal (CA)

(72) Inventors: Peter Ibrahim, Westmount (CA); Hani Vahedi, Brossard (CA); Marc-André Forget, Saint Lazare (CA)

(*) Notice: Subject to any disclaimer, the term of this patent is extended or adjusted under 35 U.S.C. 154(b) by 186 days.

(21) Appl. No.: 17/439,769

(22) PCT Filed: Mar. 17, 2020

(86) PCT No.: PCT/CA2020/050354
§ 371 (c)(1),
(2) Date: Sep. 15, 2021

(87) PCT Pub. No.: WO2020/186349
PCT Pub. Date: Sep. 24, 2020

(65) Prior Publication Data
US 2022/0192047 A1  Jun. 16, 2022

Related U.S. Application Data

(60) Provisional application No. 62/820,085, filed on Mar. 18, 2019.

(51) Int. Cl.
H05K 7/20 (2006.01)
H02M 7/00 (2006.01)
(Continued)

(52) U.S. Cl.
CPC .......... *H02M 7/797* (2013.01); *H02M 7/003* (2013.01); *H02M 7/483* (2013.01);
(Continued)

(58) Field of Classification Search
None
See application file for complete search history.

(56) References Cited

U.S. PATENT DOCUMENTS 6,116,040 A * 9/2000 Stark ..................... F04B 39/06
62/113
7,113,405 B2   9/2006 Armstrong et al.
(Continued)

FOREIGN PATENT DOCUMENTS

CN   208368494 U   1/2019
DE   102011088229 A1   10/2012
(Continued)

OTHER PUBLICATIONS

International application No. PCT/CA2020/050354 International Search Report dated Jun. 16, 2020.
(Continued)

*Primary Examiner* — Courtney L Smith
(74) *Attorney, Agent, or Firm* — Anglehart et al.

(57) ABSTRACT

A power conversion apparatus with modified cooling properties has been disclosed. The apparatus comprises an AC port, at least one DC port, a chassis, at least one power conversion module mounted in said chassis connectable to off-board conductors and said AC and said at least one DC ports, a module heat sink attached to each one of said at least one power conversion module for cooling said module, wherein said off-board inductors are mounted in said chassis together and separate from modules with one or more of an inductor heat sink and cooling fluid circulator for cooling said inductors.

11 Claims, 12 Drawing Sheets

(51) Int. Cl.
*H02M 7/483* (2007.01)
*H02M 7/797* (2006.01)

(52) U.S. Cl.
CPC .......... *H02M 7/4837* (2021.05); *H05K 7/209* (2013.01); *H05K 7/20909* (2013.01)

(56) References Cited

U.S. PATENT DOCUMENTS

| | | | |
|---|---|---|---|
| 7,450,388 | B2 | 11/2008 | Beihoff et al. |
| 7,508,289 | B1 | 3/2009 | Wernicki |
| 7,957,166 | B2 | 6/2011 | Schnetzka et al. |
| 8,159,823 | B2 * | 4/2012 | Murakami ............ H01L 23/473 180/65.31 |
| 8,531,822 | B2 | 9/2013 | Said |
| 8,547,687 | B2 * | 10/2013 | De Rijck ................ H01L 23/34 361/717 |
| 8,564,953 | B2 * | 10/2013 | Horiuchi ............... H01L 23/473 361/677 |
| 8,570,132 | B2 | 10/2013 | Doo et al. |
| 8,624,702 | B2 | 1/2014 | MacLennan et al. |
| 8,680,959 | B2 | 3/2014 | Downing |
| 8,837,119 | B2 * | 9/2014 | Kishimoto ............. H02M 5/271 361/679.48 |
| 9,084,376 | B2 * | 7/2015 | Weiss ................. H05K 7/20163 |
| 9,485,889 | B2 * | 11/2016 | Broussard .......... H05K 7/20509 |
| 9,581,234 | B2 | 2/2017 | Sung et al. |
| 10,279,760 | B2 * | 5/2019 | Froeschl ................ B60R 16/03 |
| 10,286,788 | B2 | 5/2019 | Masip |
| 10,455,730 | B2 * | 10/2019 | Haj-Maharsi .......... H05K 7/202 |
| 10,461,657 | B2 | 10/2019 | Nakamura et al. |
| 10,667,439 | B1 * | 5/2020 | Song ................. H05K 7/14322 |
| 11,224,150 | B2 * | 1/2022 | Easton .................... C02F 1/008 |
| 11,246,244 | B2 * | 2/2022 | Denk ...................... H05K 7/209 |
| 11,272,638 | B2 * | 3/2022 | Stoltz ................. H05K 7/20254 |
| 2007/0048574 | A1 | 3/2007 | Aiello et al. |
| 2011/0140535 | A1 | 6/2011 | Choi et al. |
| 2012/0020021 | A1 | 1/2012 | Kishimoto et al. |
| 2012/0261100 | A1 | 10/2012 | Aoki |
| 2015/0342087 | A1 | 11/2015 | Donth et al. |
| 2016/0126862 | A1 | 5/2016 | Vahedi et al. |
| 2017/0040907 | A1 | 2/2017 | Goto et al. |
| 2017/0096066 | A1 | 4/2017 | Lee et al. |
| 2017/0238445 | A1 | 8/2017 | Falk et al. |
| 2021/0262712 | A1 * | 8/2021 | Liu ........................ F25B 49/02 |

FOREIGN PATENT DOCUMENTS

| | | |
|---|---|---|
| EP | 2184840 A1 | 5/2010 |
| EP | 2429275 A2 | 3/2012 |
| JP | H05-002905 U | 1/1993 |
| JP | H9-23079 A | 1/1997 |
| JP | 2005348534 A | 12/2005 |
| JP | 2006246576 A | 9/2006 |
| JP | 2007-234752 A | 9/2007 |
| JP | 2009-033859 A | 2/2009 |
| JP | 2012-223033 A | 11/2012 |
| JP | 2013-78216 A | 4/2013 |
| JP | 2015-70713 A | 4/2015 |
| JP | 2015065785 A | 4/2015 |
| JP | 2015-186362 A | 10/2015 |
| KR | 101037875 B1 | 5/2011 |
| KR | 20170097885 A | 8/2017 |
| WO | 2018/138532 A1 | 8/2018 |
| WO | 2019/071359 A1 | 4/2019 |
| WO | WO-2019071359 A1 * | 4/2019 ............. B60L 53/11 |

OTHER PUBLICATIONS

International application No. PCT/CA2020/050354 Search Strategy dated Jun. 16, 2020.
International application No. PCT/CA2020/050354 Written Opinion of the International Searching Authority dated Jun. 16, 2020.
Gautam, Deepak S., et al. "An automotive onboard 3.3-kW battery charger for PHEV application." IEEE Transactions on Vehicular Technology 61.8 (2012): 3466-3474. https://delta-q.com/wp-content/uploads/2015/02/AnAutomotiveOn-Board3.3KWBatteryChargerforPHEVApplication_.pdf.
Chung, Steven, et al. "Thermal and electrical co-design of a modular high-density single-phase inverter using wide-bandgap devices." 2016 IEEE Applied Power Electronics Conference and Exposition (APEC). IEEE, 2016. http://www.ele.utoronto.ca/~ot/publications/papers/c52_chung_apec2016.pdf.
Lai, Jih-Sheng, et al. "A high-efficiency on-board charger utilitzing a hybrid LLC and phase-shift DC-DC converter." 2014 International Conference on Intelligent Green Building and Smart Grid (IGBSG). IEEE, 2014. https://sci-hub.tw/10.1109/IGBSG.2014.6835267.
Gupta, Kshitij, et al. "Thermal management strategies for a high-frequency, bi-directional, on-board electric vehicle charger." 2018 17th IEEE Intersociety Conference on Thermal and Thermomechanical Phenomena in Electronic Systems (ITherm). IEEE, 2018. https://sci-hub.tw/10.1109/ITHERM.2018.8419580.
Corresponding Indian application No. 202127039647 the Office Action dated Feb. 1, 2023.
International application No. PCT/CA2020/050354 International Preliminary Report on Patentability Chapter II dated Jun. 30, 2021.
European application No. 20774522.5 the extended European search reportdated Nov. 4, 2022.
Vahedi et al., A new five-level buck-boost active rectifier. 2015 IEEE International Conference on Industrial Technology (ICIT), IEEE, Mar. 17, 2015, pp. 2559-2564.
Corresponding Japanese application No. 2021-556237 Notification of reasons for refusal dated Sep. 22, 2023(translations retrieved from EPO Global Dossier provided).

* cited by examiner

COOLING SYSTEM FOR USE IN POWER CONVERTERS

The present application claims priority from U.S. provisional patent application No. 62/820,085 filed on Mar. 18, 2019, incorporated herein by reference.

TECHNICAL FIELD

The present relates to the field of power converters such as rectifiers and inverters used for different purposes such as residential purposes. It further relates to cooling systems used in power converters.

BACKGROUND

An example of a power converter has been disclosed by the applicant in the international PCT patent application having serial number PCT/CA2018/051291 (publication number WO/2019/071359), are capable of providing in addition to AC power, DC power for home charging units.

Such multi-level power conversion circuits use a bank of power semiconductor switches to perform power conversion, and the switches generate heat while undergoing their transition from open to closed and vice versa. In such power conversion circuits, when switching speed is increased, the size of inductors and capacitors can be reduced, and the amount of heat dissipated in such components can also be reduced. However, the heat generated by the power switches is proportional to the switching frequency.

Cooling of a power converter is important to prevent failure of the power converter.

SUMMARY

Applicant has found that a power converter can be provided with a first cooling system for its power switches, so as to manage the dissipation of a first level of heat generation, and with a second cooling system for its inductors and/or capacitors so as to manage the dissipation of a second level of heat generation, in which the switching frequency of the power switches in the power converter is selected to correspond to a heat dissipation capacity of the first cooling system and a heat dissipation capacity of the second cooling system is selected to correspond to the second level of heat generation under the conditions of the selected switching frequency. The first level of heat generation is typically much greater than the second level. However, by lowering the switching frequency of the power switches, the second level becomes significant while the first level becomes easier to manage.

The present disclosure provides complementary improvements that may be applied separately or in combination. The improvements relate to us of novel and innovative features including a housing with a separate segment for receiving the filtering and off-board components as well as an advanced cooling system for cooling switches and the off-board components.

In one broad aspect, the present disclosure provides a power conversion apparatus that comprises a housing and two or more electrical ports for receiving current from a source and delivering to a load either of which may be AC or DC. It also has one or more power conversion circuit that can connect connecting to the electrical ports having switches and mounted within said housing, a compartment at least partially separated from the rest of the housing for receiving off-board components of said at least one power conversion module; and, a heat sink for attaching to at least one of the switches to transfer heat generated by said at least one switch, wherein said compartment allows said off-board components to connect to at least one conversion module, and wherein said compartment has an additional cooling system for said off-board components.

In some embodiments, the additional cooling system may be any cooling system known in the art such as air-cooling system, fin cooling system, phase change material cooling system or liquid cooling system.

In some embodiments, the one or more of the power conversion circuits used in the converter may be bidirectional power converters.

In some embodiments, the conversion circuit may be multi-level circuit. In one embodiment, the converter circuit or modules may be multilevel converter topology including three, five or seven level topologies. The details of this novel 5 level topology have been disclosed by the applicant in the international PCT patent application having serial number PCT/CA2018/051291 with the publication number WO/2019/071359.

The converter may be any type of conversion circuit including AC-DC, DC-AC or DC-DC or an isolation circuit using switching.

In one example, the converter may include a connector backplane having plurality of module connectors, and the power conversion circuits are module converters connecting to said module connectors directly or via a connection means such as a cable or a socket.

In some embodiments, the power conversion apparatus may have a power conversion circuit comprises a buck/boost DC to DC converter circuit.

In one exemplary embodiment, the converter may have one or more baffles to redirect a flow from said liquid cooling system such as an air fan onto the off-board components to help with the cooling of the components.

It would be appreciated by those skilled in the art that the converter may use a liquid cooling system for the cooling of the converter and the additional cooling system may be formed by concentrating the air or liquid on the specific are.

In some embodiments, the compartment may be a designated part of the housing with additional cooling system with extra fans. In one embodiment, a divider plate may separate the compartment from said at least one conversion circuit.

In other examples, the compartment may be a completely separated compartment having walls and separators.

In some embodiments, the off-board components may be toroidal inductors for the converter circuit, DC-DC converter or any other parts of the converter circuitry that may be deemed to be requiring extra cooling or to spacious to be placed on the converter circuit.

Some examples of the present disclosure, the heat sink may be attached to one or more of the switches using a thermal interface material such as a thermal epoxy.

In some examples of the present disclosure, the off-bard components are connected to at least one secondary heat sink. The secondary heat sink may be the only cooling mechanism used for the off-board components or be used in combination with any other cooling techniques disclosed herein. The connection to the secondary heat sink may also be done using a thermally conductive pad or thermal epoxy.

In one embodiment, the power conversion circuit may be a rectifier circuit comprises an AC input connected to said AC port, at least one high-voltage capacitor for storing power, an inductor connected in series with said AC input, a low-voltage capacitor, two high-voltage switches connected between a first AC input terminal and opposed ends of said high-voltage capacitor, two intermediate low-voltage power switches connected between said opposed end of said high-voltage capacitor and opposed ends of said low-voltage capacitor, and two terminal low-voltage power switches connected between said opposed ends of said low-voltage capacitor and a second AC terminal, wherein a DC load can be connected to said opposed ends of said high-voltage capacitor; a modulator receiving a reference signal from a converter controller; a state selection circuit receiving said at least one comparison signal and outputting a state signal, a switching pulse generator receiving said state signal and connected to gates of said power switches. In one example of converter circuit, the converter circuit is a rectifier circuit and two high-voltage switches may be diodes.

In one other example of the conversion circuit may be a bidirectional rectifier/inverter circuit wherein said inductor is connected in series with said AC input, said low-voltage capacitor, said two high-voltage power switches connected between said first AC terminal of said AC port and opposed ends of said high-voltage capacitor, said two intermediate low-voltage power switches connected between said opposed end of said high-voltage capacitor and opposed ends of said low-voltage capacitor, and said two terminal low-voltage power switches connected between said opposed ends of said low-voltage capacitor and said second AC terminal of said AC port; wherein each of said plurality of DC ports be connected the opposed ends of said high-voltage capacitor; and wherein said controller works in an inverter mode to generate and apply to the two high-voltage power switches, said two intermediate low-voltage power switches and said two terminal low-voltage power switches signal waveforms comprising a first control signal for causing said low-voltage capacitor to be series connected with said DC port and said AC port and charged to a predetermined value proportional to a Voltage of said DC port, and a second control signal for causing said low-voltage capacitor to be disconnected from the DC port and series connected with the AC port, thereby causing the low-voltage capacitor to be discharged.

In some embodiments, the connector backplane may provide one or more connection between the conversion circuits and the off-board components. This may be achieved by using a series of internal switches.

In another improvement, the present disclosure provides a converter device with improved cooling capabilities thanks to its innovative off-board inductors supported with an independent cooling system. A circuit board can support the power conversion circuit with the power switches mounted along an edge of the board and in thermal contact with a heat exchange, for example a heat sink having cooling fins. Mounting of the power inductors to such a circuit board would create problems for mechanically supporting the inductor weight and for cooling. Placing the inductors in a separate area within a housing for the converter device can be a suitable solution. In some embodiments, a separate compartment in the housing can allow the cooling of the inductors to be more efficient and better controlled.

Furthermore, each individual converter card or module may be equipped with further cooling equipment such as heat sink equally providing additional cooling for the electronic components on-board the converter cards. Air or liquid cooling can be used, although air cooling is simpler. Heat pipes can also be used where desired.

Furthermore, the present disclosure provides the use of toroidal inductors with a five-level converter circuit which benefits from the low noise nature of the five-level circuit to reduce the size of the filtering equipment and inductors and results in production of less heat allowing the use of more basic cooling systems in the converter as well as reducing the size of the converter.

In one broad aspect, the present disclosure provides a power conversion apparatus comprising an AC port, at least one DC port, a chassis and at least one power conversion module or card having power switches. The power conversion module mounts on the chassis and connects to the off-board inductors as well as the AC and the DC ports. The apparatus also has a heat sink that connects to the power conversion modules for cooling the power switches. The off-board inductors are mounted in the chassis together separate from modules with heat sinks and/or cooling fluid circulator for cooling them.

In one embodiment, they may be mounted on a separate heat sink having fans cooling them. In the chassis or housing, the inductors can be placed in a separate compartment with its own air flow or cooling.

In some embodiments, the module may connect to the module heat sink via its switches. Meaning that one or more of the switches of the circuit may be connected to the heat sink to improve the cooling effect of the heat sink.

In some embodiments, the power conversion module may be a bidirectional power conversion module that can be used both as a rectifier and an inverter providing AC and DC output. This provides the unit to, in addition to charging, provide the possibility of receiving DC current from the car or a solar panel or any other DC source and convert it to AC for use.

In some embodiments, the conversion apparatus has more than one DC port. This can be achieved by having one conversion card with multiple outputs or multiple cards within the chassis.

In one embodiment, the inductors have a separate compartment from the rest of the device allowing easier circulation of cooling liquid such as air by the use of separate fans dedicating to cooling the inductor compartment.

In some embodiments, the power conversion cards can be multi-level rectifier/inverter circuit. In one embodiment, the power conversion module comprises one high-voltage capacitor for storing power at a voltage boosted, and a circuit. The circuit comprises one inductor connected in series with the AC port, a low-voltage capacitor, two high-voltage switches connected between a first AC input terminal and opposed ends of said high-voltage capacitor, two intermediate low-voltage switches connected between said opposed end of said high-voltage capacitor and opposed ends of said low-voltage capacitor, and two terminal low-voltage switches connected between said opposed ends of said low-voltage capacitor and a second AC terminal wherein a DC load can be connected to the opposed ends of said high-voltage capacitor, and a controller having at least one sensor for sensing current and/or voltage in said circuit and connected to a gate input of said two intermediate low-voltage switches and said two terminal low-voltage power switches. It will be appreciated by those skilled in the art that any power conversion system including any multiple level conversion circuit can be used alternatively.

In one embodiment, the controller multi-level rectifier/inverter circuit is operative for causing the rectifier/inverter circuit to operate in a boost mode wherein a voltage of said high-voltage capacitor is higher than a peak voltage of said AC input, and said two intermediate low-voltage power switches and said two terminal low-voltage power switches are switched with redundant switching states in response to a measurement of a voltage present at said low-voltage capacitor so as to maintain said low-voltage capacitor at a predetermined fraction of a desired voltage for said high-voltage capacitor and to thus maintain said high-voltage capacitor at a desired high voltage, with said rectifier circuit supplying said DC load and absorbing power as a five-level active rectifier with low harmonics on said AC input.

In some embodiments, the chassis comprises a connector backplane which has a plurality of module sockets and at least one power conversion module connected in the module socket.

In some embodiments, a baffle is used in the converter to redirect the flow from cooling fluid circulator or fans onto the inductors. This would provide better cooling for the inductors. In one embodiment, the conversion apparatus may also include a divider plate separating said inductees from the modules. In some embodiments, inductors used may be toroidal inductors.

In one embodiment, the power conversion apparatus may also include a buck/boost converter circuit for converting DC power having a buck/boost inductor.

In one example, the buck/boost inductor is mounted in the chassis together with the conversion circuit inductors.

In some embodiments, the power conversion apparatus may have module heat sinks air fans may be used for cooling the modules and the that are attached to the power conversion modules using a thermal interface material. The thermal interface material facilitates the heat transfer between the modules and the heat sink.

In some embodiments the inductors, including both conversion module inductors and the buck/boost inductors may be connected to the inductor heat sink with a thermally conductive pad and/or using a thermal epoxy.

In some embodiments, air fans may be used for cooling the modules and the inductors. In some embodiments separate fans may be used of the modules and the inductors.

In one more broad aspect, the present disclosure provides a method providing a power converter having at least one power conversion module comprising at least one off-board component and a number of semiconductor power switches. The method comprising selecting a switching frequency of said number of semiconductor power switches of said at least one power conversion module, providing a first cooling system having a first cooling capacity for said switches based on heat generated from said switches at said selected switching frequency, and providing a second cooling system having a second cooling capacity for said off-board components based on heat generated by said at least one off-board component at said selected switching frequency.

In some examples the method may further comprise adjusting said first cooling capacity of said first cooling system based on a first temperature of said switches.

In some examples the method may further comprise adjusting said second cooling capacity and second cooling capacity based on a second temperature of said at least one off-board component.

Provided are systems, methods and more broadly technology as described herein and claimed below.

BRIEF DESCRIPTION OF THE DRAWINGS

The present examples will be better understood with reference to the appended illustrations which are as follows.

DESCRIPTION

Figure 1A:
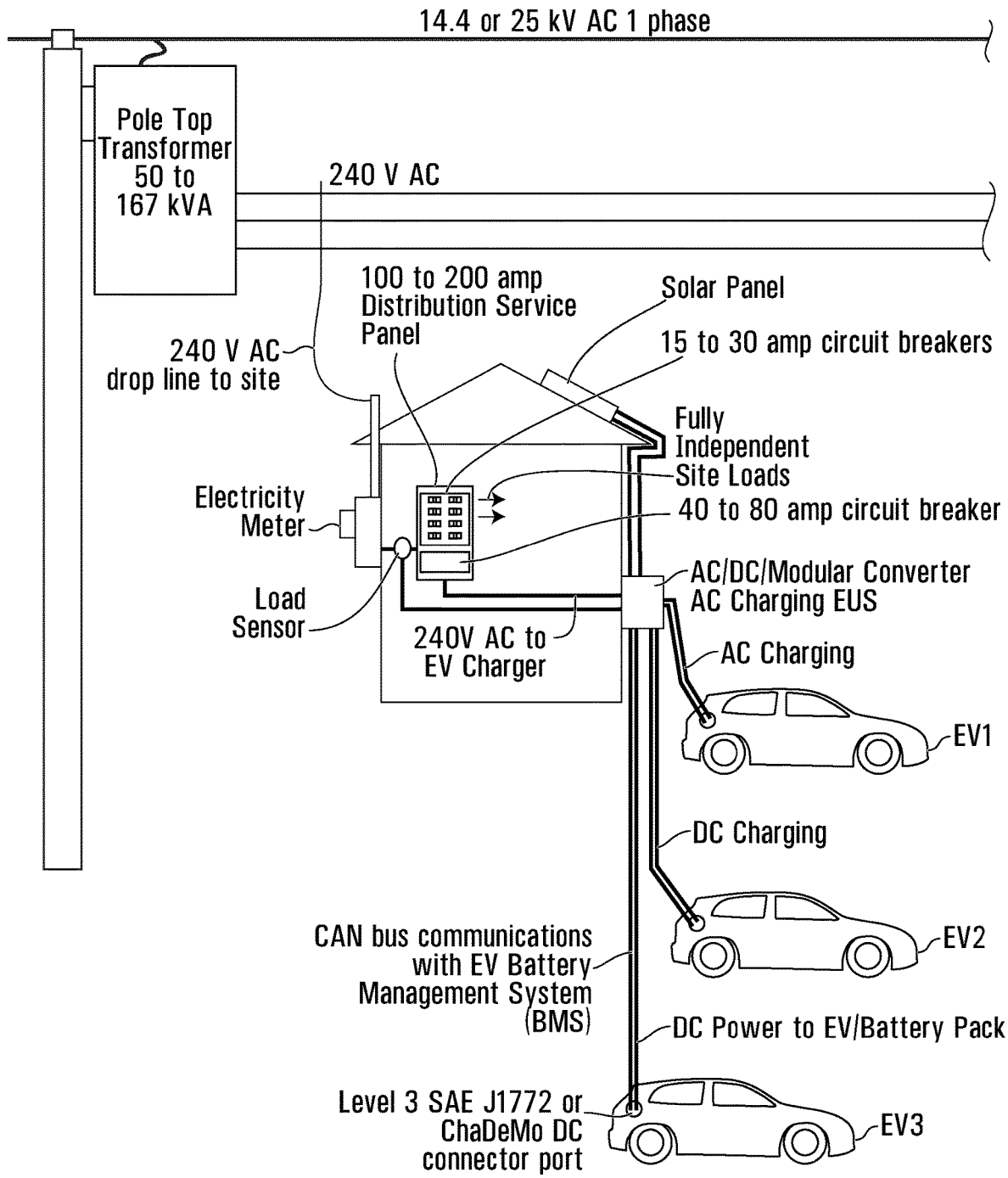
FIG. 1A is a schematic illustration of the physical installation of a home EV charging system including a pole-top transformer, residential electrical entry with a load sensor and a main circuit breaker panel, a 240 V AC power line between the panel and an apparatus, two cable connection extending between the apparatus and an electric vehicle (EV) with CAN bus connection between the EV and the apparatus and a solar panel connection.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Moreover, the described features, structures, or characteristics of the invention may be combined in any suitable manner in one or more embodiments. It will be apparent to those skilled in the art that various modifications and variations can be made to the present invention without departing from the scope of the invention. Thus, it is intended that the present invention cover the modifications and variations of this invention provided they come within the scope of the appended claims and their equivalents. Reference will now be made in detail to the preferred embodiments of the invention.

FIG. 1.A illustrates the physical context of an embodiment in which split single phase main power is delivered from a utility pole top transformer, as is the most common type of electrical power delivery in North America. The transformer receives typically 14.4 kV or 25 kV single-phase power from a distribution line and the transformer can handle approximately 50 kVA to 167 kVA of power delivered as split phase 240 VAC to a small number of homes or electrical entries. Each electrical entry is typically configured to handle between 100 A to 200 A of power at 240 VAC, namely about 24 kVA to 48 kVA (the common assumption is that 1 kVA is equivalent to 1 kW). As shown, the conversion apparatus or device connects to the network via the AC connection and can connect to multiple vehicles and/or solar panel. This could be achieved thanks to bidirectional (rectifier/inverter) nature of the apparatus which provides it by the capability of receiving AC or DC power from one port and providing AC or DC from other ports.

It will be appreciated by those skilled in the art that despite the single phase entry illustration, the embodiments of present disclosure are not restricted to split single phase 240 VAC power systems and that any of the embodiments disclosed herein may be adapted to work with different power networks delivering AC voltage.

The electrical entry typically comprises a usage meter, the main breaker having a rating corresponding to the total permitted load (e.g. 100 A or 200 A), and a panel having circuit breakers for each household circuit which may be supplied with 240 VAC power or 120 VAC power from the split phase 240 VAC input. While most circuit breakers have capacities of between 15 A to 30 A, some can be lower (namely 10 A) and some may be larger, such as 40 A, for large appliances. In some countries, electrical entries have a lower capacity, such as 40 A to 60 A, and in countries with 240 VAC in all household circuits, the power is not a split phase, but regular single phase 240 VAC (the voltage level used can vary from about 100 V to 250 V).

As illustrated in FIG. 1, the conversion apparatus/converter is connected to a circuit breaker of the main panel through a breaker having a larger current rating, such as 40 A to 80 A, although the apparatus disclosed can consume over 100 A if desired. The need for a circuit breaker specific to the apparatus is determined by electrical codes. The cable connecting the apparatus to the panel is rated for such high current. The connection to the electrical panel can be a direct fixed wiring, or a high-voltage socket can be installed and connected to the electrical panel such that the apparatus connects to the panel using a cable and plug, for example, those that are similar to those used for appliances like ovens or clothes dryers. The apparatus is shown to be connected to a single load sensor that senses the load drawn by the whole panel including the apparatus.

The apparatus cable can be a conventional apparatus cable and plug, as is known in the art.

Figure 1B:
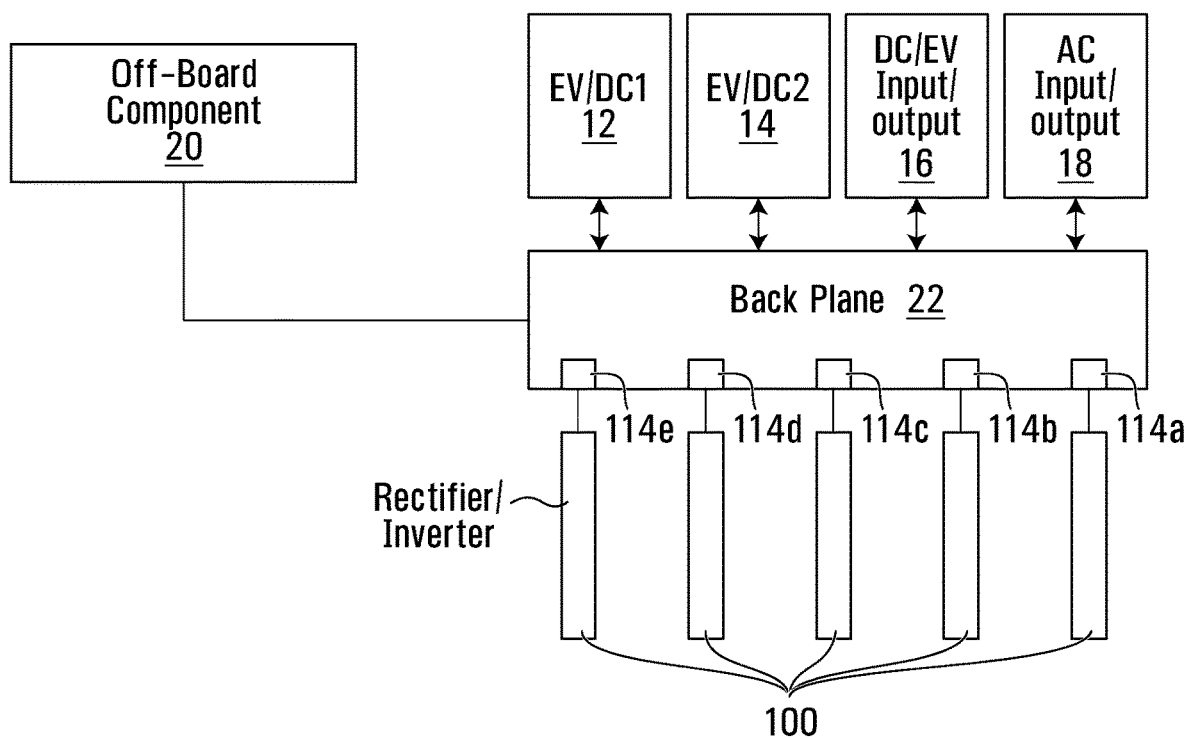
FIG. 1B is a block diagram showing a power conversion apparatus with multiple DC and AC ports and off-board component panel in accordance to one embodiment of the present disclosure.

Furthermore, as illustrated in FIG. 1A, the converter may connect to a solar panel, as well as one or more electric vehicle.

FIG. 1.B is a block diagram showing an exemplary power conversion apparatus 10 with an AC port 18, multiple DC and EV/DC ports 12 and 14, DC/EV input port 16, and an off-board component panel 20. As illustrated in FIG. 1A, the ports 12 and 14 may connect to EV1 and EV2 and DC/EV port 16 may connect to solar panels to use the DC energy produced by the panels.

In some embodiments, the apparatus 10 may be adapted to receive DC current from a first port such as EV/DC port 12 of the plurality of DC ports and deliver variable voltage to a second port such as the EV/DC port 14. This may be achieved by using a plurality of switches that may be located on a backplane 22 on conversion circuit module 100 or on a separate switching module that may connect to the backplane or directly to the conversion circuit modules 100.

It will be appreciated by those skilled in the art that, although module 100 is shown to be a bidirectional conversion module, any other type of modules such as rectifier, inverters, DC-DC, buck boost module and surge protector module, depending on the need, may be used in the converter device.

Figure 8:
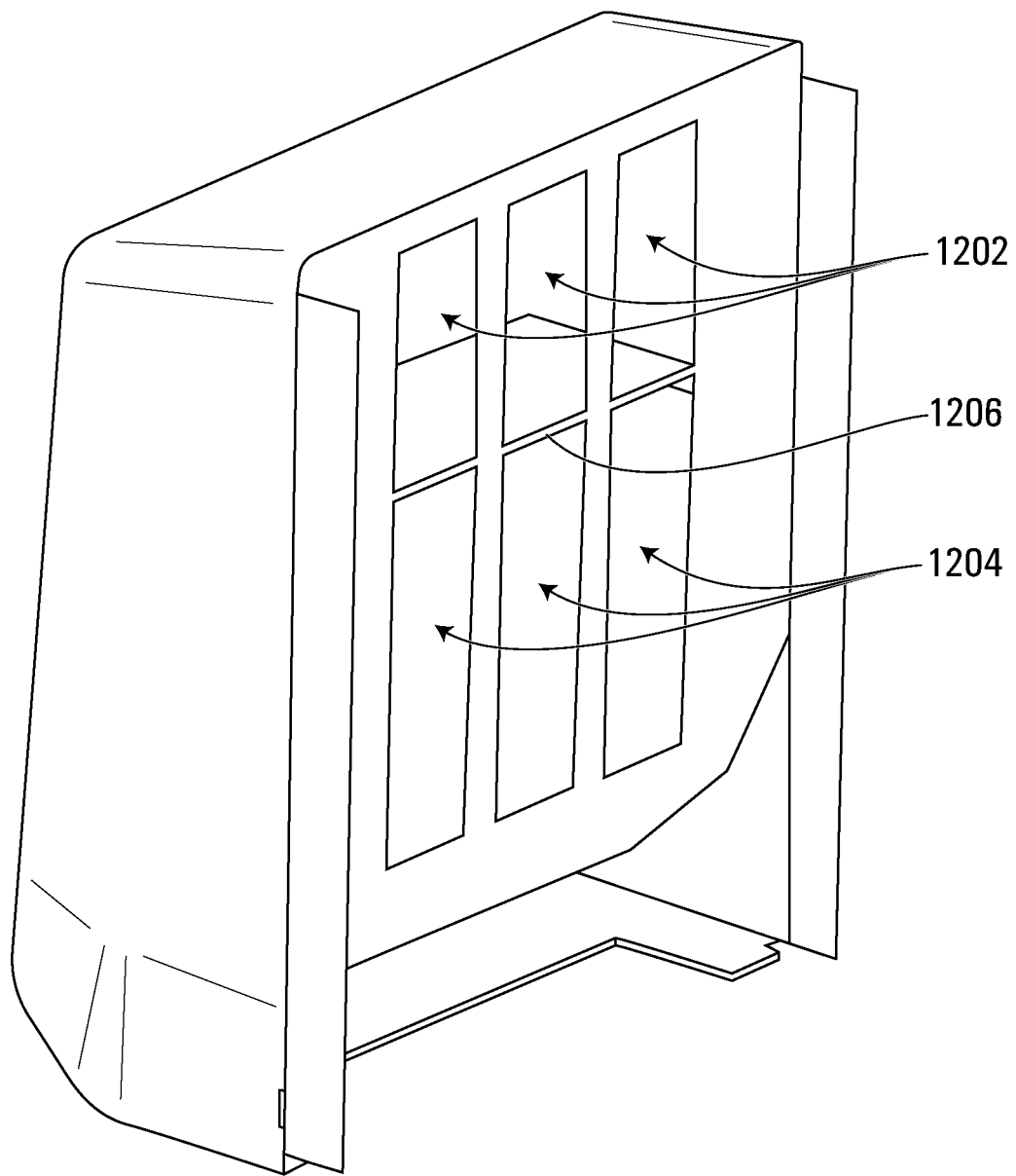
FIG. 8 is a perspective view of the power conversion apparatus shown in FIG. 7 having exposures for conversion module and inductor heat sinks.

As illustrated in FIG. 8, in one example, the first port 12 and the second port 14 are located on the same power conversion circuit 100, while in other examples they may be located on different power conversion circuits or on a backplane 22 of the apparatus.

Referring back to FIG. 1B, the converter modules 100 may connect to the backplane 22 using connector 114 (here shown as connectors 114a, 114b, 114c, 114d, 114e each connecting to one module 100). The converter 10 may also benefit from an off-board component board 20 which in this embodiment is used for purposes of housing the inductors.

Figure 2A:
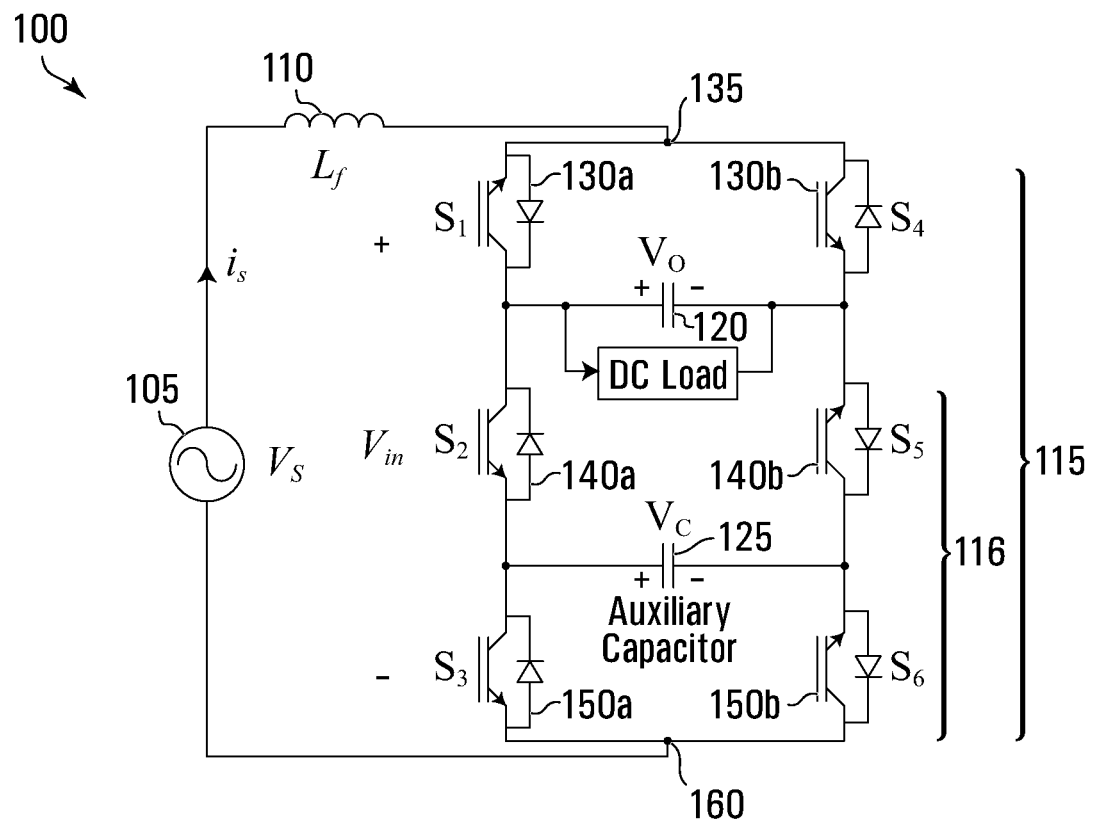
FIG. 2A shows a circuit diagram of a conversion circuit with a 5-level topology circuit working in a rectifier mode, according to a particular example of implementation.
Figure 2B:
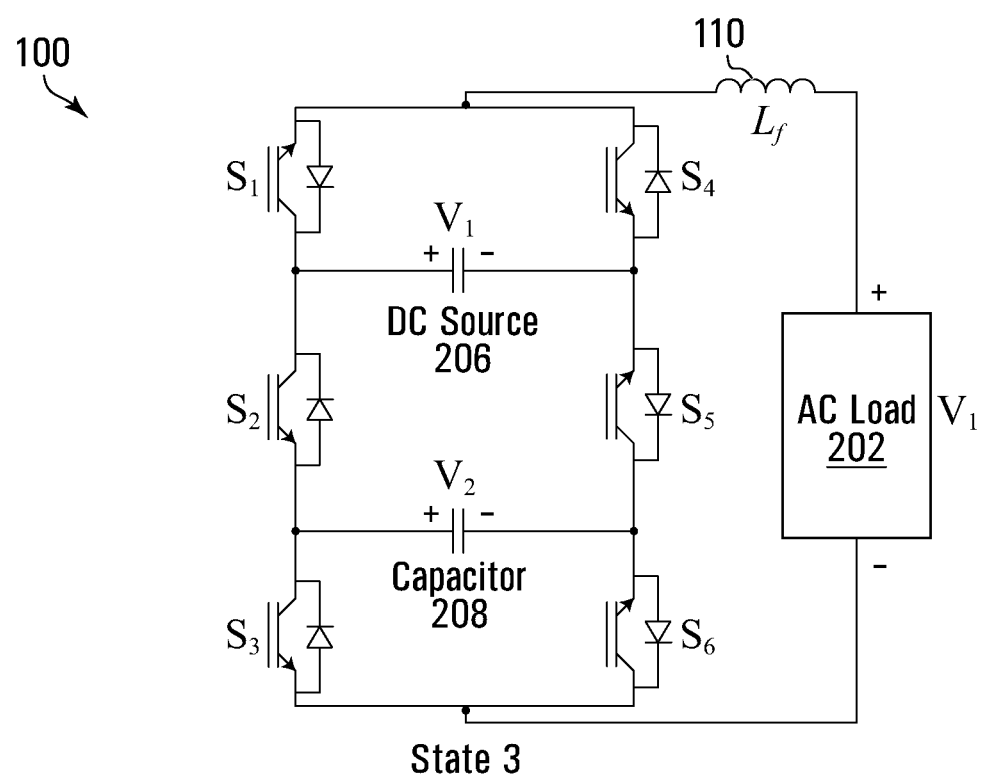
FIG. 2B shows a circuit diagram of a battery apparatus converter with a 5-level topology circuit working in an inverter mode, in accordance with one embodiment of the present disclosure.

FIG. 2A to 2B show details of an example of the type conversion circuit modules 100 that may be used in the conversion apparatus or device 10 for an electric vehicle according to a particular example of implementation.

As shown in FIG. 2A an exemplary conversion circuit 100 working in the rectifier mode comprises an AC input 105, an inductive filter 110 connected in series with the AC input 105, and a 5-level topology circuit 115.

In some examples, the inductive filter 110 in this non-limiting example may be a 2.5 mH inductor. Conveniently the present design allows for a small geometry of the overall power conversion circuit 100, due in part to the small size of the inductive filter 110. The inductive filter 110 can vary according to design as chosen based on the application, power rating, utility voltage harmonics, switching frequency, etc. Although the simplest such filter is a single inductor, in an alternative embodiment the inductive filter 110 may include a combination of inductor(s) and capacitor (s), e.g., an (e.g., 2mH) inductor connected to a capacitor (e.g., 30 µF), itself connected to ground. The choice of the filter has an impact on the overall size of the design and losses, with a bigger filter increasing the size of the overall design and generally incurring more losses.

The 5-level circuit may comprise a high-voltage capacitor 120, at least one low-voltage capacitor 125, two high-voltage power switches 130a, 130b connected between a first terminal 135 and respective opposed ends 145a, 145b of the high-voltage capacitor 120, two intermediate low-voltage power switches 140a, 140b, each connected between respective ones of the two opposed end 145a, 145b of the high-voltage capacitor 120 and respective opposed ends 155a, 155b of the low-voltage capacitor 125, and two terminal low-voltage p1ower switches 150a, 150b each connected between a second input terminal 160 and respective ones of the opposed ends 155a, 155b of the low-voltage capacitor 125.

As illustrated in FIG. 2B, the power conversion module 100 may use the power operate in bidirectional states. That means that 5-level circuit must have the high-voltage power switches 130a, 130b, and cannot replace them replaced them with two diodes, to convert voltage/current from AC to DC in a rectifier mode as shown in FIG. 2A or from DC to AC in an inverter mode as shown in FIG. 2B with an AC load 202 and a DC source 206

The details of the converter module (module 100), how it works, and its switching details has been disclosed by the applicant in the international PCT patent application having serial number PCT/CA2018/05129 with the Publication Number WO/2019/071359.

For practical implementation, a power conversion apparatus comprising the power conversion circuit 100 may comprise a user-interchangeable DC vehicle charging cable and charging plug, e.g., having a compatible format for fitting a standardized plug/socket (i.e., SAE J1772, ChaDeMo, or other) in an EV.

It will be appreciated by those skilled in the art that any kind of connector can be used as a backplane and the purpose of module connector is only to facilitate and simplify the installation process for the user and any kind of connector can be used as the backplane.

Furthermore, it will be appreciated by those skilled in the art that the power conversion apparatus may benefit from a user interface that may have a screen and have wired or wireless connection with an end device such as a computer or cellphone through an application to allow the user manually adjust the variants through such interface. This adjustment may be giving priority to the charging of the devices, giving a schedule for charging, managing how the solar panel DC is consumed and distributed or any other function required by the user in term of adjusting input and output of the device throughout the day.

Moreover, it will be understood by those skilled in the art that the AC and DC outputs can use a separate or same physical outlet or cable. In some embodiments, the outlet is capable of communicating with the vehicle's charge controller.

As described herein, in different embodiments the power conversion circuit 100 may have off-board or on-board components such as inductors and switching elements. Furthermore, the power conversion circuit 100 may have a buck/boost circuit integrated in it.

Figure 3:
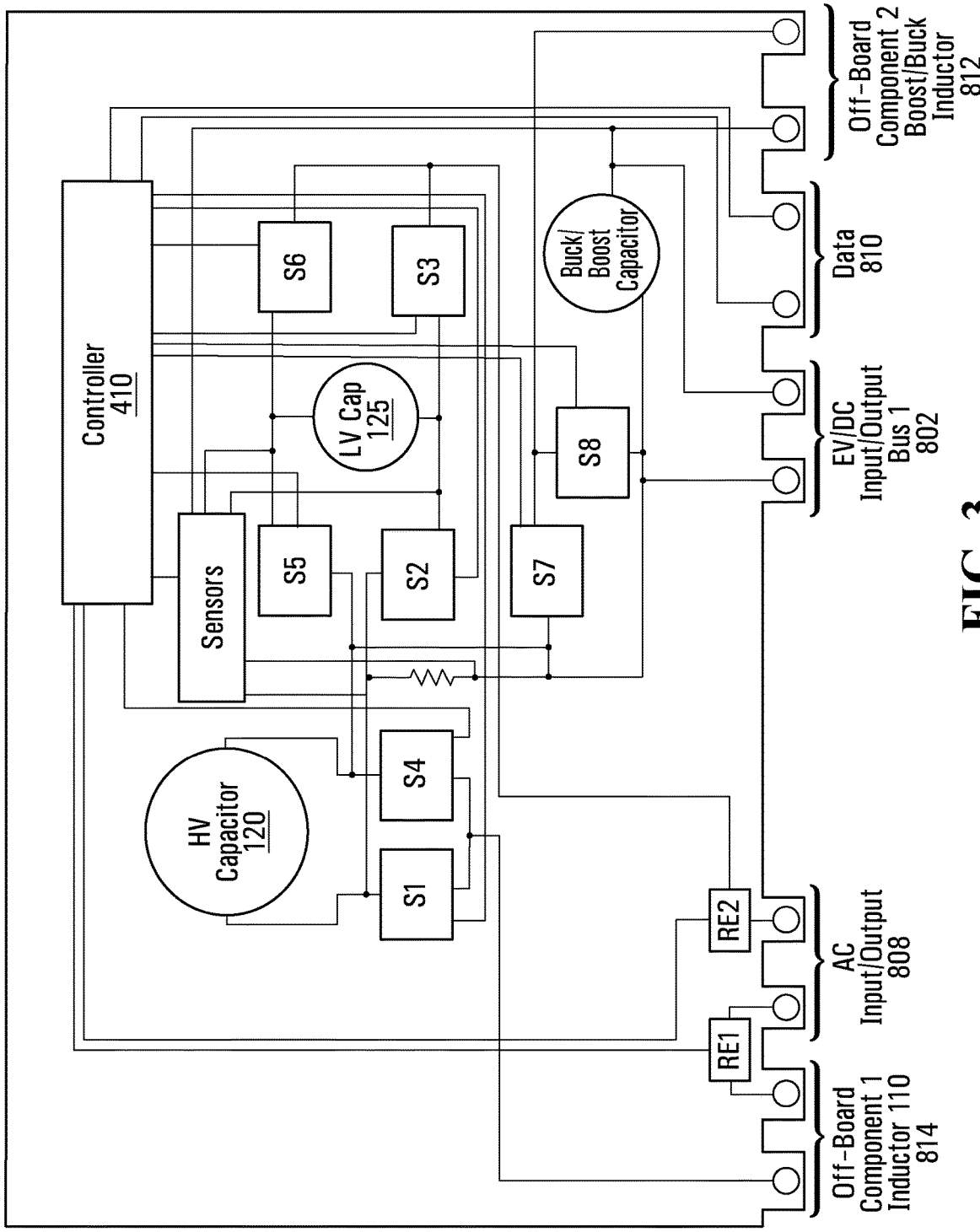
FIG. 3 is a schematic illustration of a power converter module in accordance with one embodiment of the present disclosure.

FIG. 3 shows the power converter module 100 in an embodiment wherein it has only one DC port and one AC port. The ports 812 and 814 may be used to connect the power converter module 100 to its off-board components in this example being the inductive filter/inductor 110 for port 814 and a buck/boost inductor 1012.

Figure 5:
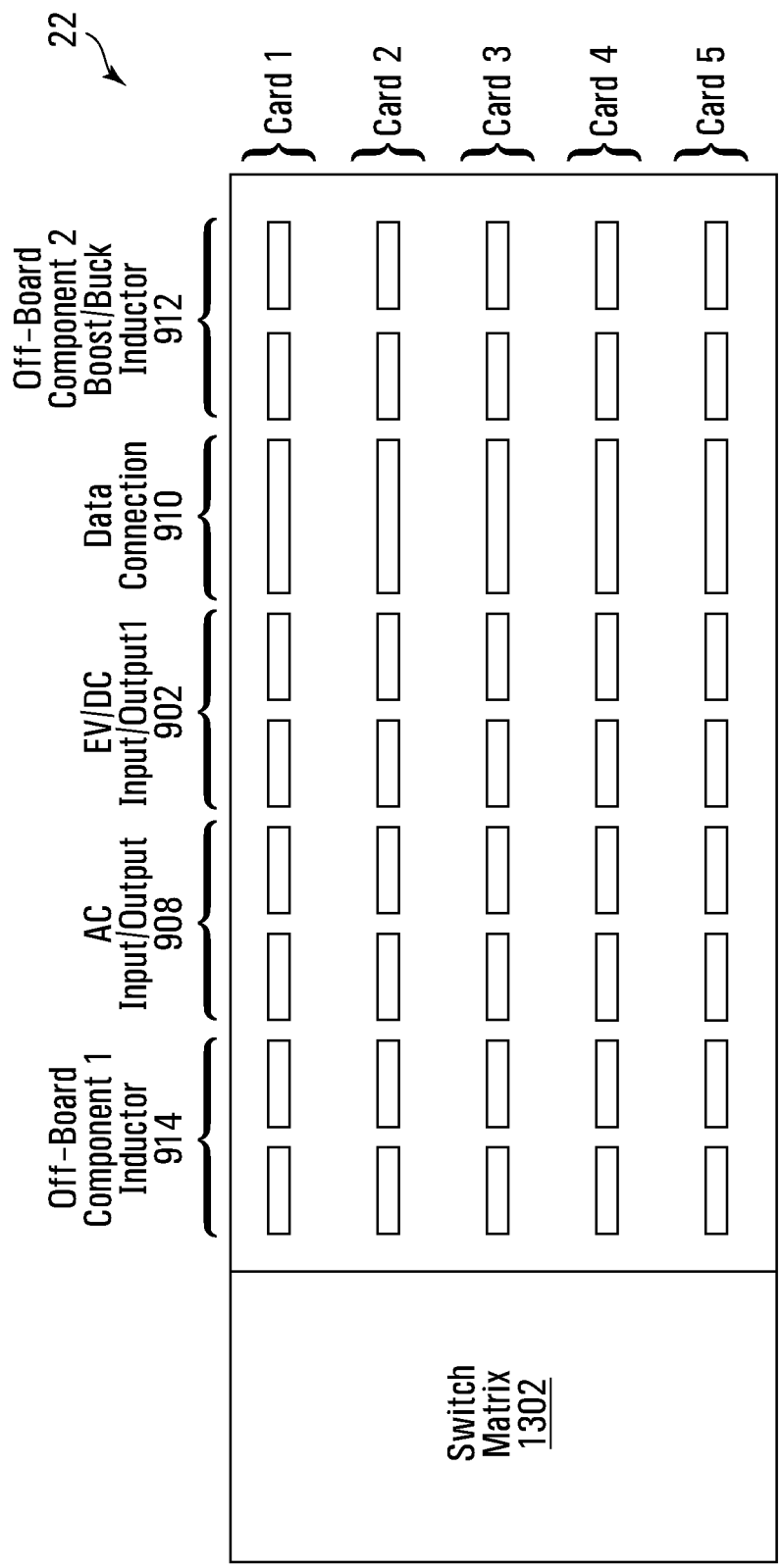
FIG. 5 is a schematic illustration of a backplane working with the power converter module shown in FIG. 3 in accordance with one embodiment of the present disclosure.

FIG. 5 shows an example of the backplane 22 which may be used by the power converter module 100 in FIG. 3. As explained, in this embodiment, all the switching can be done the backplane 22 via a switching matrix 1302. Again, there are five series of connectors for cards 1 to 5 and each series of the connector has connectors 912, 910, 902, 908 and 914 which receives respectively ports 812, 810, 802, 808 and 814 of the power converter module 100 as shown in FIG. 3.

Figure 4:
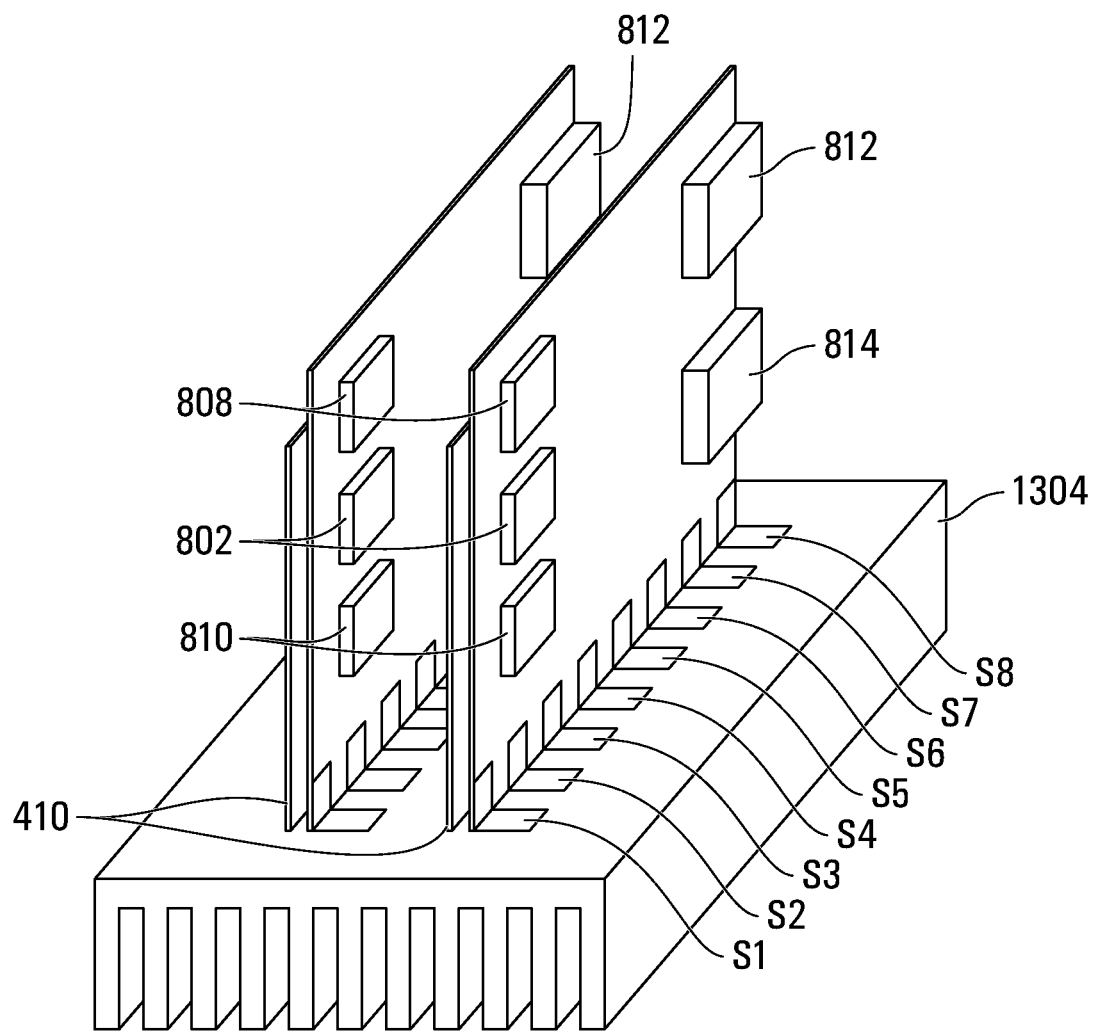
FIG. 4 is a schematic illustration of two power converter modules having their switches connected to a module heat sink in accordance with one embodiment of the present disclosure.

Referring now to FIG. 4, it illustrates an embodiment of the present disclosure in which the switches S1 to S8 of two modules 100 are connected to the module heat sink to provide better cooling for the module and the ports are on the board. The AC, DC and Data port 808, 802 and 810 may be connected to the corresponding ports via cable instead of using the backplane 22. Furthermore, the controller 410 may have its own separate circuit which connects to the module through a port (not shown in the drawing) on the back of the converter module/circuit board.

In some embodiments the connection of the switches may be use a thermal interface material to provide better cooling. The thermal heating material may be any of the material commonly known and used in art such as thermal epoxy.

It will be appreciated by those skilled in the art that, although in this embodiment a switching matrix has shown exist on the backplane connector 22, in some embodiments, may not have a switching matrix or may benefit from additional switching to connect ports to each other in a different order and combination. These switching may be present on the module 100 or be connected to the backplane as a separate In some embodiments, the converter apparatus does not have the backplane connector 22 with for receiving the modules. The ports 812, 810, 802, 804, 806, 808 and 814 can be directly connected to the AC and DC ports as well to the ports of the off-board inductors 110 and off-board inductor 16 on the panel 20.

Figure 6:
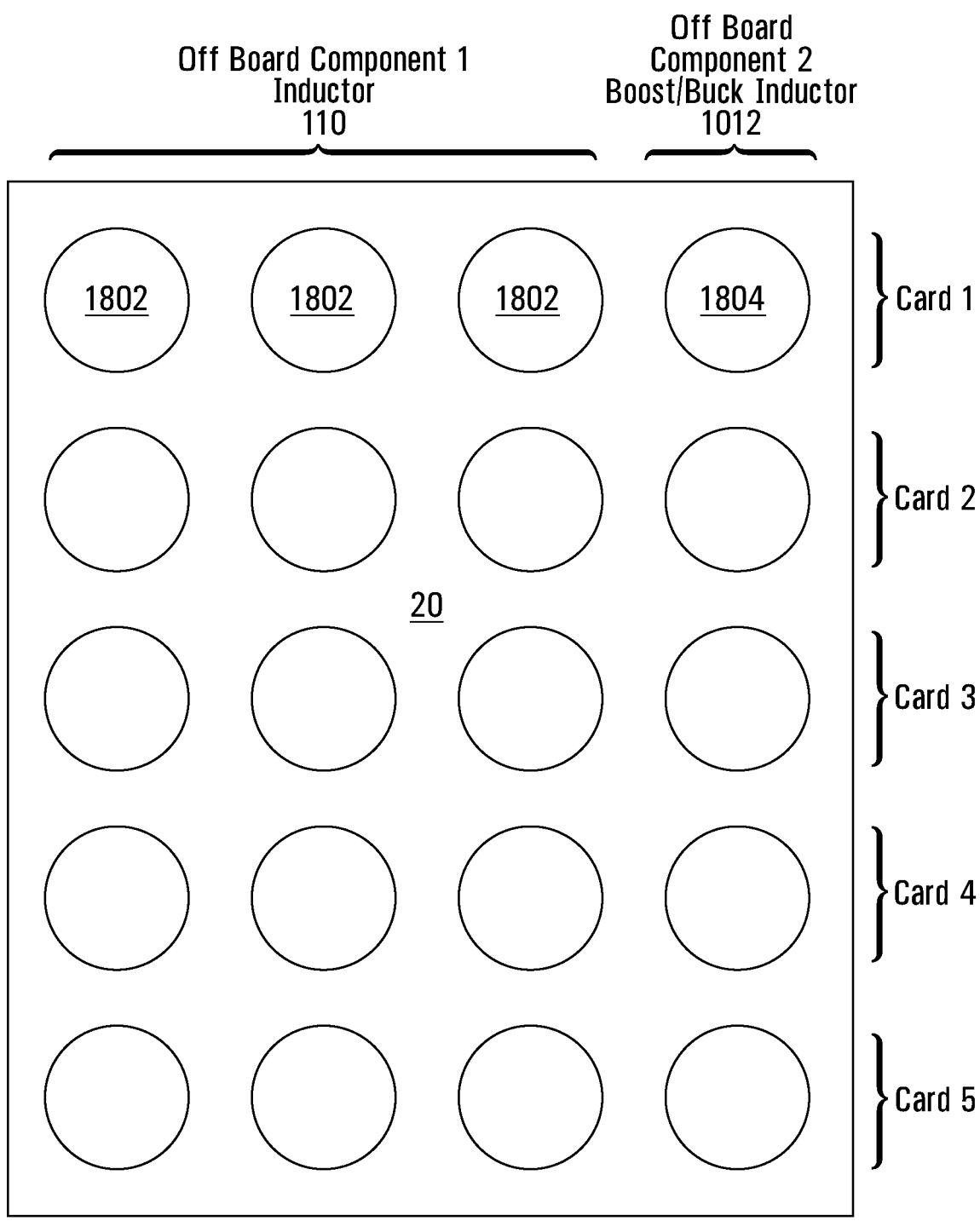
FIG. 6 is a schematic illustration of an off-board component panel in accordance to one embodiment of the present disclosure.
Figure 10:
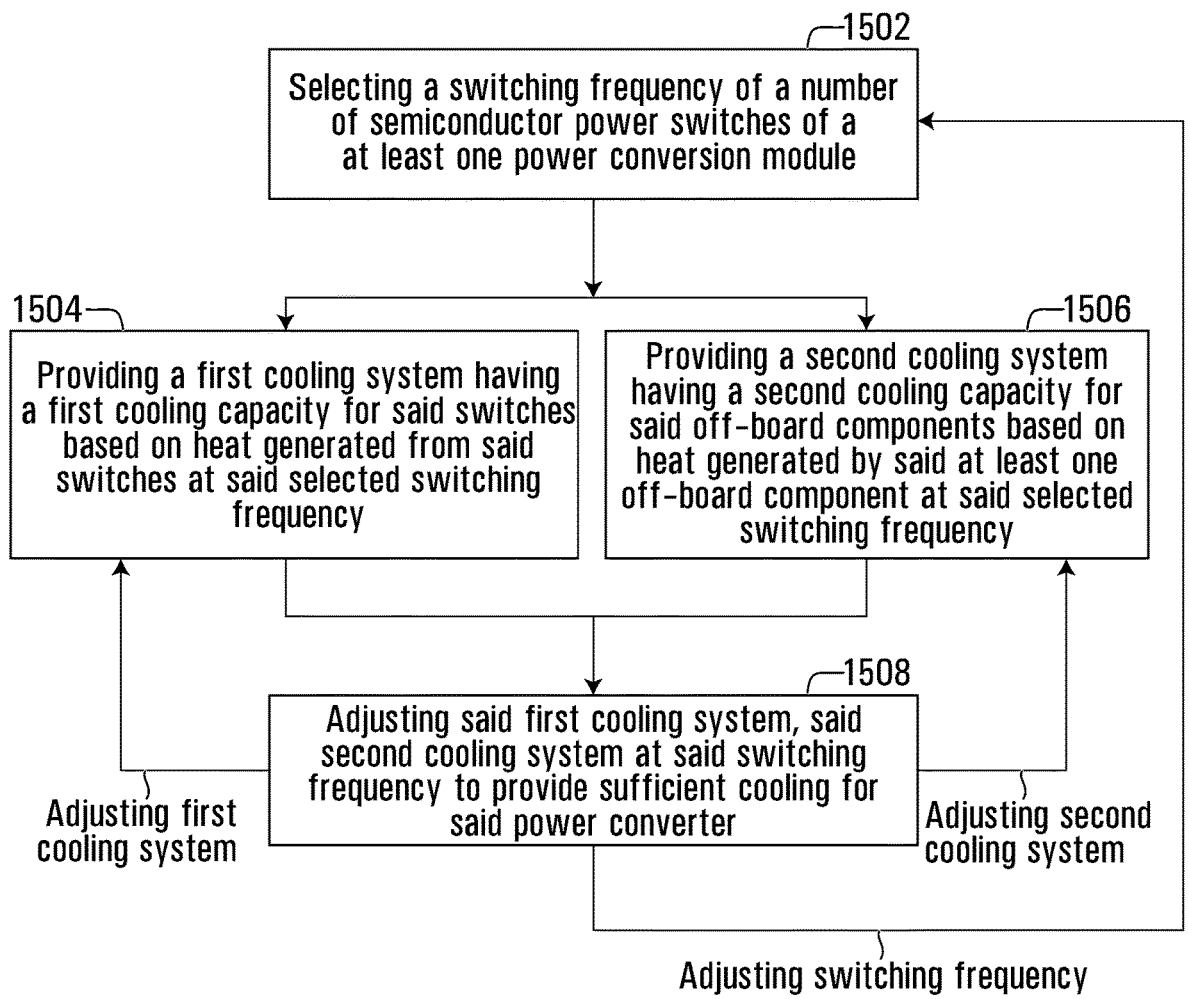
FIG. 10 is a flowchart showing the steps taken to operate a power converter in accordance with one embodiment of the present disclosure.

FIG. 6 illustrates an example of the off-board panel 20 having enough room for off-board components of the five modules 100. In one embodiment, as illustrated in FIG. 10, the inductor 110 can be one or more toroidal inductors connecting to the board 20 by a connector 1802 (here, three toroidal inductors are shown) and the buck/boost inductor 1012 may be a toroidal inductor connecting to the board 20 via another connector 1802. It will be appreciated by those skilled in the art that the board 20 may have different connectors that may be used for connecting different types of off-board component, including other types of inductors.

In some embodiments, the panel 20 may be connected to one or more heat sinks that helps with the cooling of the inductors. In some alternative embodiment, the inductors 100 and 1012 may be placed in a sandwich of heat sinks, two heat sinks placed on two sides of the off-board components, to provide cooling for the inductors.

The board 20 may be connected to the backplane directly or have a modular connection to the backplane. Similarly, the off-board component may be fixed permanently on the board or have sockets/connectors allowing them to be replaced or changed.

In some embodiments, the location of the panel 20 may be separated from the converter modules 100

As illustrated in FIG. 8, in one embodiment, the present disclosure provides a power conversion apparatus 1100 with a chassis or housing 1102. As illustrated, the panel 20 may be mounted on the chassis 1102 separately from the modules 100 at the upper part of the device 1100.

It will be appreciated by those skilled in the art that the panel 20 which works as the off-board compartment may be an integral part of housing or chassis dedicated to off-board components.

In one embodiment, the conversion apparatus 1100 has one or more specific frames 1104 located on the back part of the chassis 1102 for additional fluid cooling system (not shown here) which may be a fluid circulation device, an air cooling system, a fin cooling system, a phase change material cooling system, a liquid cooling system. In embodiment illustrated an air fan, liquid cooling system in addition to a heat sink may be used. These additional fans may be dedicated to cooling the off-board components i.e. inductors or alternatively shared with the rest of the converter but with higher flow or cooling effect on the off-board components.

Figure 7:
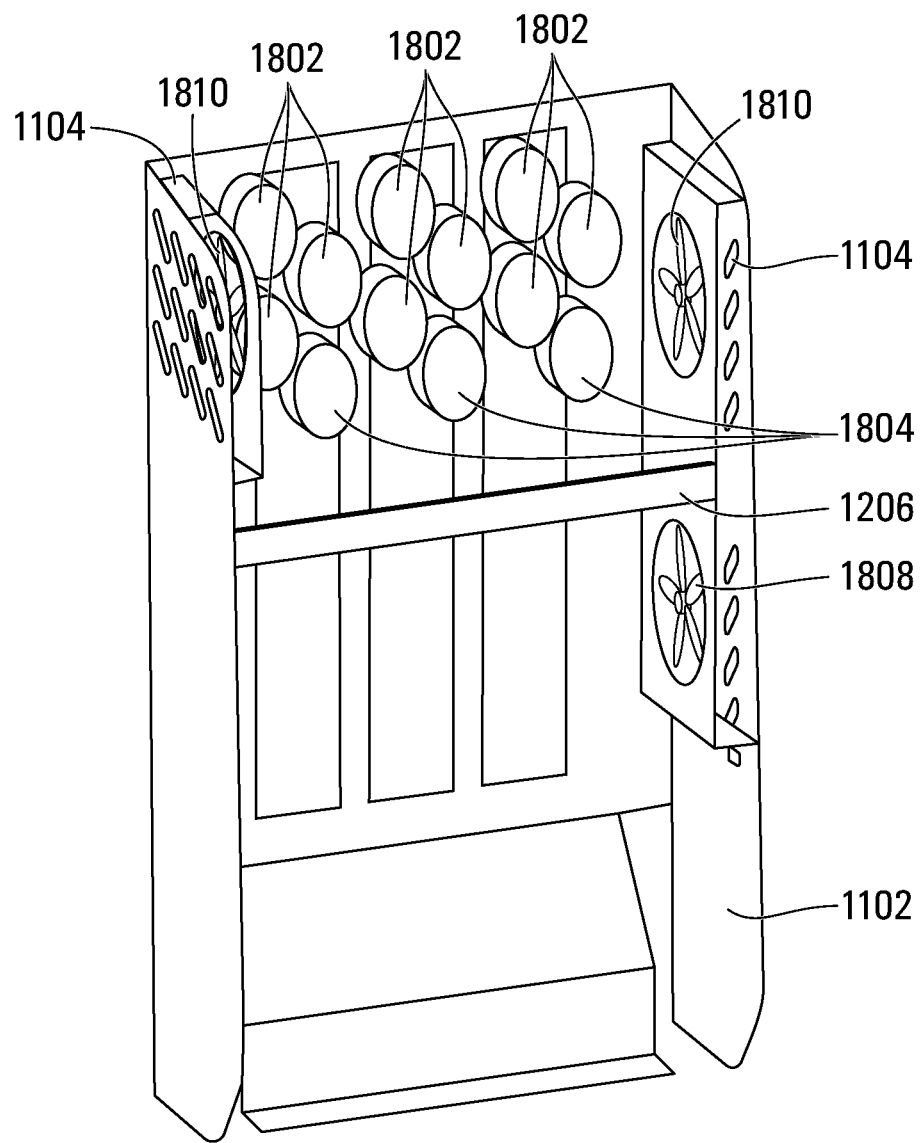
FIG. 7 is a perspective view of a power conversion apparatus having its off-board component at the top of the chassis/housing in accordance to one embodiment of the present invention.

As illustrated in FIG. 7 a (first) cooling system, in this example a fan 1808, may be used to cool the converter modules and a separate cooling system, in this example fans 1810 may be used for cooling of the off-board components. Also as illustrated, a separating panel 1206 may be used to form a (second) separate compartment for the off-board components, here the inductors 1802 and 1804.

It will be appreciated by to those skilled in the art that the cooling systems, here referred to as fans 1810 and 1808, may have variable cooling capacity that may be adjusted based on the frequency at which the converter modules 100 works.

Furthermore, the converter may have temperature sensors that can send the temperature of each part of the converter to a controller to control the cooling systems or to control them directly.

FIG. 8 shows the back of the chassis or housing 1102 which provides the conductor heat sink exposures 1202 for the panel 20 or alternatively, in some embodiments where the inductors are assembled directly on the heat sinks, heat sink 1304' (not shown here) to cool down the off-board components.

In this embodiment, the module heat sink exposure frames 1204 may further allow the heat sinks 1304 to connect to the converter modules 100 to be cooled down. In one embodiment, the back of the chassis has a gap 1404 which allows the cooling of the heat sinks 1304 and 1304'.

It will be appreciated that the heat sink 1304 and 1304' and their respective frames may be the same size of different sizes.

As illustrated, in some embodiments, a separating panel 1206 may separate the compartment 20 from the conversion modules 100. This may allow the better circulation of the air and cooling of the conductors.

Figure 9:
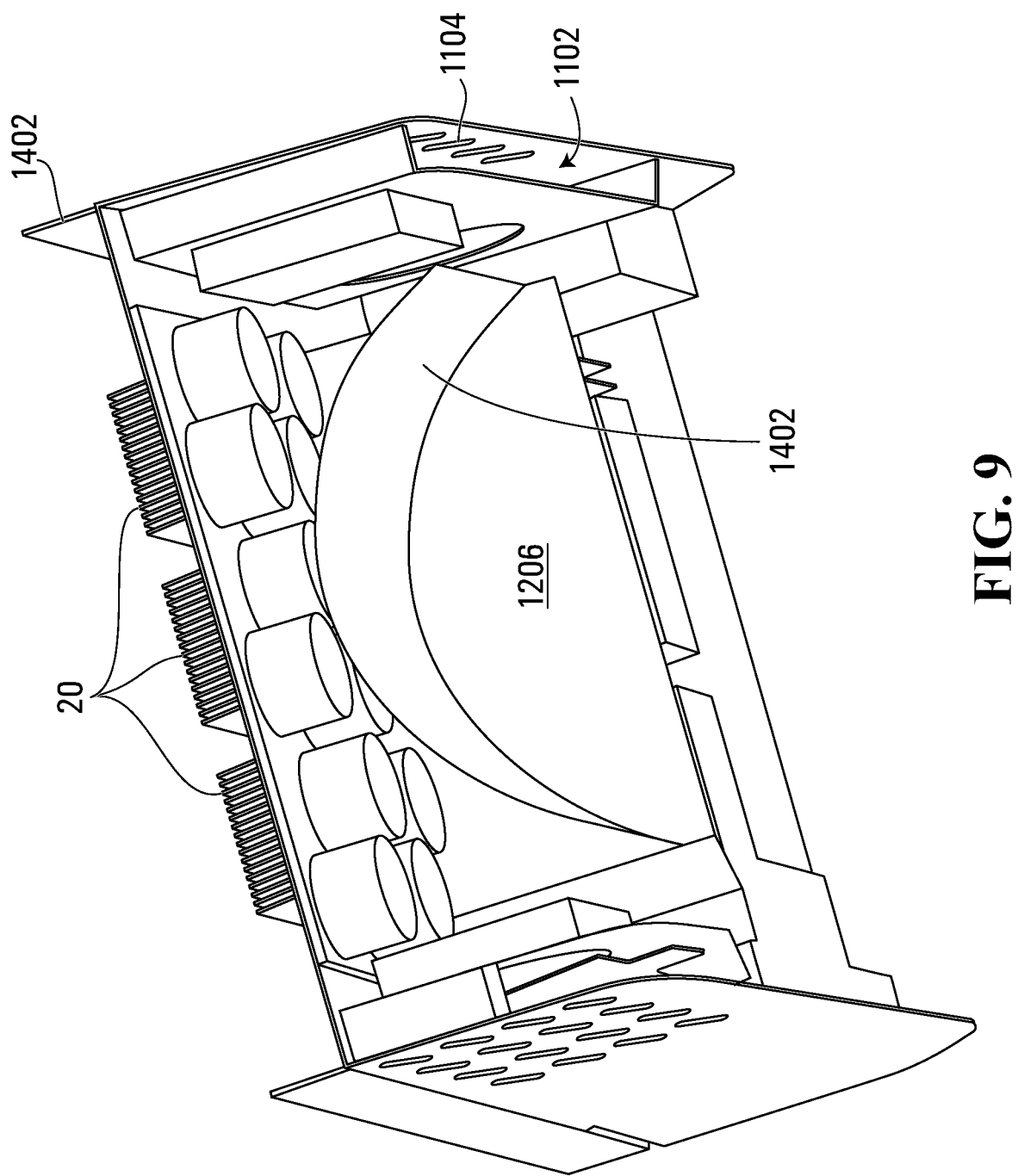
FIG. 9 is a top perspective view of the power conversion apparatus shown in FIG. 7 having a baffle and a separating panel with inductor heat sinks exposed from the back of the apparatus according to one embodiment.

FIG. 9 shows the converter apparatus 1100 and how the off-board components of three modules 100 and the panel/compartment 20 are located inside the chassis or housing 1102.

FIG. 10 shows an example of a method for a method providing a power converter having at least one power conversion module which includes at least one off-board component and a number of semiconductor power switches.

As illustrated in FIG. 10, box 1502, a switching frequency for the number of semiconductor power switches of the power conversion module may be selected. As in box 1504, a first cooling system may have a first cooling capacity for the switches of the converter based on the heat generated from said switches at said selected switching frequency is provided. In some embodiments, the heat generated by the switches may increase by an increase in the frequency in which switches work. As illustrated in box 1506 a second cooling system having a second cooling capacity for said off-board components based on heat generated by said at least one off-board component at said selected switching frequency may be provided. Again the heat generated may be dependent on the frequency of which the capacitor works.

It will appreciate by those skilled in the art that cooling capacity of the cooling systems may be adjustable by different methods for example, adding or increasing the liquid or air circulation, opening further liquid channels, etc.

In one example, as shown in box 1506, the method may further comprise adjusting the heat capacity of the first and/or the second cooling system to provide required cooling for the switches and the off-board components.

It will be appreciated by those skilled in the art that the adjustment to the heating system may be applied at the design and production or during use by making changes to the cooling systems or by activating or deactivating different elements and parts of the cooling systems.

The person skilled in the art would appreciate that in some examples the system may adjust the switching frequency in a range allowable based on our off-board components such as inductors while providing enough cooling using one or both cooling systems In some embodiments, as illustrated in FIG. 9, a baffle panel 1402 may be added to the converter apparatus 1100. The baffle panel 1402 directs the air circulation towards the inductors and provides better cooling for the inductors.

In one embodiment, the baffle 1402 may provide the additional cooling quality required for off-board components of the modules 100.

In an alternative embodiment, the compartment or panel 20 may be a completely separated space dedicated to cooling of the inductors.

It will be appreciated by those skilled in the art that while in the embodiment disclosed herein air and ordinary fans have been used for cooling of the inductors and/or the modules, any other type of fluid cooling system known in the art can be used alternatively without exceeding the scope of the invention.

It will be appreciated by those skilled in the art that while as described herein, the power conversion modules may be PUC5 topology as disclosed by the applicant in the international PCT patent application having serial number PCT/CA2018/051291 with the publication number WO/2019/071359. but any other type of power conversion circuit may be alternatively used in combination with the heat sinks and fluid cooling design disclosed herein.

It will be appreciated by those skilled in the art that any type of rectifier, inverter or rectifier/inverter may be used in combination to provide the desired AC and DC outputs as described herein. An example of such conversion circuits may be a multi-level rectifier/inverter circuit.

It will be appreciated by those skilled in the art that the power conversion apparatus and the circuitry described in this application such as the 5-level rectifier circuit can be used in any AC to DC conversion systems such as a DC supply, other EV chargers, any other type of battery apparatus, or any other implementation requiring AC to DC conversion.

Although the above description has been provided with reference to a specific example, this was for the purpose of illustrating, not limiting, the invention.

What is claimed is:

1. A power conversion apparatus comprising:
an AC port;
at least one DC port;
a chassis;
at least one power conversion module mounted in said chassis and connected to a controller, said at least one power conversion module comprising a number of semiconductor power switches driven at a switching frequency by said controller, at least one off-board component, a connector for said AC port, at least one temperature sensor connected to said controller and a connector for said at least one DC port;
a first cooling system, having a first heat dissipation capacity, for dissipating heat from said number of semiconductor power switches when driven at said switching frequency;
a second cooling system, having a second heat dissipation capacity, for dissipating heat from said at least one off-board component when said number of semiconductor power switches are driven at said switching frequency; and
wherein said controller is configured to adjust said switching frequency in response to said at least one temperature sensor to correspond to and prevent exceeding said first heat dissipation capacity of the first cooling system and said second heat dissipation capacity of the second cooling system.

2. The power conversion apparatus of claim 1, wherein said at least one power conversion module is a bidirectional power conversion module.

3. The power conversion apparatus in claim 1, wherein said at least one DC port is at least two DC ports.

4. The power conversion apparatus of claim 1, wherein said at least one power conversion module is at least two power conversion modules and the power conversion apparatus provides DC to DC charging.

5. The power conversion apparatus of claim 1, further comprising a compartment separate from said modules comprising at least one inductor and one or more of an inductor heat sink and cooling fluid circulator.

6. The power conversion apparatus of claim 1, wherein said at least one power conversion module is a multi-level rectifier/inverter circuit.

7. The power conversion apparatus of claim 1, wherein said first cooling system comprises at least one fan arranged to blow air over a block heat sink with fins of said heat sink and mounted in a first air duct.

8. The power conversion apparatus of claim 7, wherein said second cooling system comprises at least one fan arranged to blow air over at least said inductors within a second air duct.

9. A method for controlling a power conversion apparatus comprising an AC port, at least one DC port, a chassis, and at least one power conversion module mounted in said chassis and connected to a controller, said at least one power conversion module comprising at least one temperature sensor connected to said controller, at least one off-board component, a connector for said AC port, and a number of semiconductor power switches, the method comprising:

defining in said controller a switching frequency of said number of semiconductor power switches of said at least one power conversion module;

providing a first cooling system having a first heat dissipation capacity for said number of semiconductor power switches based on heat generated from said switches at said selected switching frequency;

providing a second cooling system having a second heat dissipation capacity for said at least one off-board component based on heat generated by said at least one off-board component at said selected switching frequency; and adjusting, using said controller, said switching frequency in response to said at least one temperature sensor to correspond to and prevent exceeding said first heat dissipation capacity of the first cooling system and said second heat dissipation capacity of the second cooling system.

10. The method in claim 9, further comprising adjusting said first cooling system based on a first temperature of said switches.

11. The method in claim 9, further comprising adjusting said second heat dissipation capacity based on a second temperature of said at least one off-board component.

* * * * *